(12) United States Patent
Lee

(10) Patent No.: US 8,558,258 B2
(45) Date of Patent: Oct. 15, 2013

(54) NITRIDE SEMICONDUCTOR LIGHT EMITTING DEVICE AND FABRICATION METHOD THEREOF

(75) Inventor: Suk Hun Lee, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/524,688

(22) Filed: Jun. 15, 2012

(65) Prior Publication Data

US 2012/0248411 A1 Oct. 4, 2012

Related U.S. Application Data

(63) Continuation of application No. 11/719,932, filed as application No. PCT/KR2005/004121 on Dec. 5, 2005, now Pat. No. 8,222,654.

(30) Foreign Application Priority Data

Dec. 23, 2004 (KR) ........................ 10-2004-0111088

(51) Int. Cl.
*H01L 33/20* (2010.01)
(52) U.S. Cl.
USPC .................................. 257/94; 257/13; 257/95
(58) Field of Classification Search
USPC ............. 257/9, 13, 14, 15, 17, 22, 94, 96, 97, 257/103, 193, 200, E33.008, E33.009, 257/E33.01, E31.035, E31.036, E29.072, 257/E29.074, E29.298
See application file for complete search history.

(56) References Cited

U.S. PATENT DOCUMENTS

| | | | |
|---|---|---|---|
| 4,956,204 A | | 9/1990 | Amazawa et al. |
| 6,172,382 B1 | | 1/2001 | Nagahama et al. |
| 6,242,761 B1 | | 6/2001 | Fujimoto et al. |
| 6,266,355 B1 | * | 7/2001 | Sverdlov .................. 372/45.01 |
| 6,316,785 B1 | | 11/2001 | Nunoue et al. |
| 6,319,742 B1 | | 11/2001 | Hayashi et al. |

(Continued)

FOREIGN PATENT DOCUMENTS

| | | |
|---|---|---|
| JP | 11-251631 A | 9/1999 |
| JP | 2000-124500 A | 4/2000 |

(Continued)

OTHER PUBLICATIONS

Office Action dated Jun. 6, 2008 in Chinese Application No. 200580040963.3, filed Dec. 5, 2005.

(Continued)

*Primary Examiner* — Cuong Q Nguyen
*Assistant Examiner* — Yosef Gebreyesus
(74) *Attorney, Agent, or Firm* — Saliwanchik, Lloyd & Eisenschenk

(57) ABSTRACT

The present invention relates to a nitride semiconductor light emitting device including: a substrate having a predetermined pattern formed on a surface thereof by an etch; a protruded portion disposed on a non-etched region of the substrate, and having a first buffer layer and a first nitride semiconductor layer stacked thereon; a second buffer layer formed on the etched region of the substrate; a second nitride semiconductor layer formed on the second buffer layer and the protruded portion; a third nitride semiconductor layer formed on the second nitride semiconductor layer; an active layer formed on the third nitride semiconductor layer to emit light; and a fourth nitride semiconductor layer formed on the active layer. According to the present invention, the optical extraction efficiency of the nitride semiconductor light emitting device can be enhanced.

14 Claims, 5 Drawing Sheets

(56) References Cited

U.S. PATENT DOCUMENTS

| | | |
|---|---|---|
| 6,365,921 B1 | 4/2002 | Watanabe et al. |
| 6,380,108 B1 | 4/2002 | Linthicum et al. |
| 6,455,337 B1 | 9/2002 | Sverdlov |
| 6,515,308 B1 | 2/2003 | Kneissl et al. |
| 6,830,948 B2 | 12/2004 | Koike et al. |
| 6,855,620 B2 | 2/2005 | Koike et al. |
| 6,979,835 B1 | 12/2005 | Yu et al. |
| 7,053,420 B2 | 5/2006 | Tadatomo et al. |
| 7,462,867 B2 | 12/2008 | Tezen |
| 7,791,062 B2 | 9/2010 | Lee |
| 2001/0035534 A1 | 11/2001 | Takeya et al. |
| 2002/0111044 A1 | 8/2002 | Linthicum et al. |
| 2002/0117104 A1 | 8/2002 | Hata et al. |
| 2002/0137249 A1 | 9/2002 | Ishida et al. |
| 2003/0010993 A1 | 1/2003 | Nakamura et al. |
| 2003/0016526 A1 | 1/2003 | Sakai et al. |
| 2003/0092230 A1 | 5/2003 | Koike et al. |
| 2003/0107047 A1 | 6/2003 | Okuyama et al. |
| 2003/0162340 A1 | 8/2003 | Tezen |
| 2003/0178633 A1 | 9/2003 | Flynn et al. |
| 2004/0048448 A1 | 3/2004 | Koike et al. |
| 2004/0113166 A1 | 6/2004 | Tadatomo et al. |
| 2004/0119084 A1 | 6/2004 | Hsieh et al. |
| 2004/0206969 A1 | 10/2004 | Orita |
| 2004/0227140 A1 | 11/2004 | Lee et al. |
| 2005/0006651 A1 | 1/2005 | LeBoeuf et al. |
| 2005/0174041 A1 | 8/2005 | Li |
| 2005/0179130 A1 | 8/2005 | Tanaka et al. |
| 2005/0230688 A1* | 10/2005 | Lee ................................ 257/79 |
| 2006/0081860 A1* | 4/2006 | Watanabe et al. ............... 257/97 |

FOREIGN PATENT DOCUMENTS

| | | |
|---|---|---|
| JP | 2001-185493 A | 7/2001 |
| JP | 2001-267242 A | 9/2001 |
| JP | 2001-313259 A | 11/2001 |
| JP | 2002-280609 A | 9/2002 |
| JP | 2003-518737 A | 6/2003 |
| KR | 10-2000-0061358 A | 10/2000 |
| KR | 10-2000-0065567 A | 11/2000 |
| KR | 2002-0021247 A | 3/2002 |
| KR | 2002-0079659 A | 10/2002 |
| WO | WO-02/23640 A1 | 3/2002 |
| WO | WO-02/45223 A1 | 6/2002 |
| WO | WO-2004/017431 A1 | 2/2004 |

OTHER PUBLICATIONS

Kim, K. H. et al. (2003). III-nitride Ultraviolet Light-Emitting Diodes with Delta Doping. *Applied Physics Letters*, 83(3): 566-568.

Nakarmi, M. L. et al. (2003). Enhanced p-type Conduction in GaN and AlGaN by Mg-delta-doping. *Applied Physics Letters*, 82(18): 3041-3043.

Office Action dated Jun. 28, 2011 in Japanese Application No. 2007-548058, filed Jun. 19, 2007.

Office Action dated Feb. 12, 2013 in Japanese Application No. 2007-548058, filed Dec. 5, 2005.

* cited by examiner

US 8,558,258 B2

NITRIDE SEMICONDUCTOR LIGHT EMITTING DEVICE AND FABRICATION METHOD THEREOF

CROSS-REFERENCE TO RELATED APPLICATIONS

This application is a continuation of U.S. application Ser. No. 11/719,932, filed May 22, 2007, which is the U.S. national stage application of International Patent Application No. PCT/KR2005/004121, filed Dec. 5, 2005, which claims priority to Korean Patent Application No. 10-2004-0111088, filed Dec. 23, 2004, all of which are incorporated herein by reference in their entirety.

TECHNICAL FIELD

The present invention is relative to a nitride semiconductor light emitting device and fabrication method thereof, and to a nitride semiconductor light emitting device and a fabrication method thereof that can enhance the optical extraction efficiency.

BACKGROUND ART

In order to increase the optical extraction efficiency of a nitride semiconductor light emitting device, a nitride semiconductor layer is grown on a patterned substrate.

In a related art method of fabricating a nitride semiconductor light emitting device, a sapphire substrate or a silicon carbide (SiC) substrate is selectively patterned in a predetermined shape by using a mask material. An exposed portion of the substrate is selectively dry etched. The mask material is then removed to thereby obtain a substrate with a predetermined pattern. A nitride semiconductor layer is grown on the patterned substrate.

FIG. 1 illustrates a stack structure of a related art nitride semiconductor light emitting device. As shown in FIG. 1, the related art nitride semiconductor light emitting device includes a patterned substrate 101, an n-GaN layer 103 serving as a first electrode contact, an active layer 105 emitting light, a p-GaN layer 107 serving as a second contact layer, and first and second electrodes 109 and 111 through which a bias voltage is applied.

According to the related art, a nitride semiconductor light emitting device is fabricated using a patterned sapphire substrate (PSS), and light emitted toward the sapphire substrate is again reflected to a surface of the light emitting device, whereby the optical extraction efficiency is improved. The mask material may be $SiO_2$, $Si_2N_4$, insulating material, or metal material, which can be easily removed after an etching process.

Also, the optical extraction efficiency can be improved using a SiC substrate. Unlike the PSS, a flip chip is applied for obtaining a large-area high-power light emitting device. In order to maximize the optical extraction efficiency, a rear surface of the SiC substrate is etched. In this method, after a basic etching shape, a lateral angle and a topology are simulated, the etching is performed under the condition in which a maximum extraction efficiency can be obtained. Further, a texturing process may be performed on a surface of the etched substrate.

Also, a process of patterning the surface of the substrate and a process of patterning the rear surface of the substrate may be selectively performed according to the required performance of the applied product.

Meanwhile, according to the method in which the surface of the sapphire substrate is selectively etched and the nitride semiconductor light emitting device is grown to thereby increase the optical extraction efficiency, the substrate generally has a trench structure. The detailed trench structure of the substrate is illustrated in FIG. 2.

However, while the buffer layer of a low temperature and the GaN layer of a high temperature are grown in the surface of the trench and the non-etched surface of the sapphire substrate, the GaN layer is grown in c-axis direction within the trench and fills the trench. In the interface with the GaN layer grown in the surface, a large amount of treading dislocation (TD) is densely gathered, resulting in degradation in the reliability of the light emitting device.

This result is caused by the difference of growth rate between the surface of the trench and the surface of the sapphire substrate. Also, the surface state of the trench with predetermined depth and area is rough due to the dry etching and the surface energy of the etched sidewall is very high, the growth rate of the GaN layer is relatively high in the surface.

Also, since the growth rate in the trench is fast, when a portion meets the GaN layer grown in the sapphire substrate, a lateral growth is dominantly in progress, thus forms a void. The void is illustrated in a portion A of FIG. 3.

In addition, the GaN layer grown within the trench has relatively more crystal defect (TD, etc.) than the GaN layer grown in the sapphire substrate. Although the crystal defect density is determined by the surface roughness of the trench, the depth and the patterned shape, much crystal defect exists in the GaN layer grown within the trench. The crystal defect passes through the active region of the light emitting device and propagates up to the surface, exhibiting a high leakage current and a low reverse breakdown voltage (Vbr). Consequently, the crystal defect greatly influences the reliability of the light emitting device. The crystal defect propagated up to the surface of the light emitting device provides a pathway of a current, causing the reduction of ESD characteristic in human body mode.

According to the related art method of fabricating the nitride semiconductor light emitting device, in order to improve the optical extraction efficiency, the sapphire substrate is masked and patterned in a predetermined shape, such as a strip, a rectangle, a hexagon, and a pyramid. Then, a patterned sapphire substrate (PSS) method is widely used which performs a dry etching to a depth of 0.1~3 μm. However, in the nitride semiconductor light emitting device using the PSS method, the surface roughness in the surface and the side of the sapphire substrate is different and the surface energy is different. Therefore, due to the difference of the growth mode of the initial nitride semiconductor, crystal defect density contained in the nitride semiconductor grown on the respective surfaces becomes different. Consequently, the crystal defect density causes the leakage current in the nitride semiconductor light emitting device and thus badly influences the reliability such as the optical power and life time in long-term operation.

DETAILED DISCLOSURE

Technical Problem

The present invention is to provide a nitride semiconductor light emitting device and a fabrication method thereof, capable of improving the optical extraction efficiency, life time, and operational reliability of the device.

Also the present invention is to provide a nitride semiconductor light emitting device and a fabrication method thereof, in which a reflection part is formed on a substrate to reflect that may be emitted out of a substrate, whereby the light output is improved and crystal defect caused by the reflection part can be reduced.

Technical Solution

According to an aspect of the present invention, there is provided a nitride semiconductor light emitting device including: a substrate having a predetermined pattern formed on a surface thereof by an etch; a protruded portion disposed above a non-etched region of the substrate, and having a first buffer layer and a first nitride semiconductor layer stacked; a second buffer layer formed above the etched region of the substrate; a second nitride semiconductor layer formed above the second buffer layer and the protruded portion; a third nitride semiconductor layer formed above the second nitride semiconductor layer; an active layer formed above the third nitride semiconductor layer to emit light; and a fourth nitride semiconductor layer formed above the active layer.

According to another aspect of the present invention, there is provided a nitride semiconductor light emitting device including: a substrate having a predetermined pattern formed on a surface thereof by an etch; a protruded portion disposed on a non-etched region of the substrate, and having a first buffer layer and a first nitride semiconductor layer stacked; a second buffer layer formed above the etched region of the substrate; a second nitride semiconductor layer formed above the second buffer layer and the protruded portion; an active layer formed above the second nitride semiconductor layer to emit light; and a third nitride semiconductor layer formed above the active layer.

According to a further another aspect of the present invention, there is provided a method of fabricating a nitride semiconductor light emitting device, including: forming a protruded portion comprised of a first buffer layer and a first nitride semiconductor layer above a substrate and etching a surface of the substrate where the protruded portion is not formed, to a predetermined depth; forming a second buffer layer above the etched region of the substrate; forming a second nitride semiconductor layer above the second buffer layer; forming a third nitride semiconductor layer above the second nitride semiconductor layer; forming an active layer emitting light above the third nitride semiconductor layer; and forming a fourth nitride semiconductor layer above the active layer.

Advantageous Effects

According to the present invention, the optical extraction efficiency and operational reliability of a nitride semiconductor light emitting device can be improved.

Also, the light that may be lost is reflected and thus the utilization of light increases, thereby improving the luminous efficiency. Also, crystal defect caused by a patterned portion of a substrate is suppressed, thereby much improving the operational reliability of the light emitting device.

BRIEF DESCRIPTION OF THE DRAWINGS

The spirit of the present invention will be understood more apparently from the accompanying drawings. In the drawings:

FIG. 4 is a sectional view of the SEGSS structure before an etching process, FIG. 5 is a sectional view of the SEGSS structure after an etching process, and FIG. 6 is a plan view of the SEGSS structure after an etching process.

FIG. 11 is a sectional view of an SEGSS structure after an etching process, and FIG. 12 is a sectional view of an SEGSS structure when a second buffer layer is further formed after an etching process.

MODE FOR INVENTION

Hereinafter, the embodiments of the present invention will be described in detail with reference to the accompanying drawings.

EMBODIMENT 1

Figure 1:
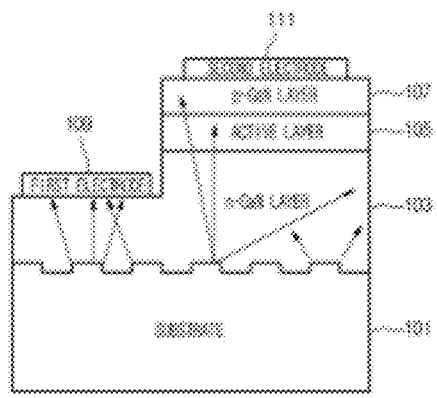
FIG. 1 is a sectional view illustrating a stack structure of a related art nitride semiconductor light emitting device.
Figure 2:
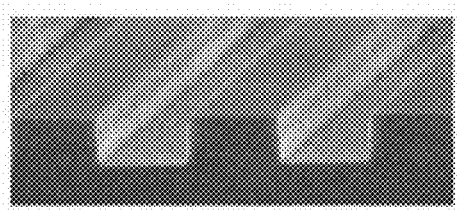
FIG. 2 is a photograph of a substrate for explaining a trench structure.
Figure 3:
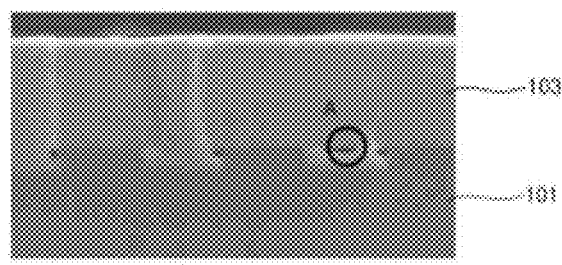
FIG. 3 is a sectional view of a semiconductor light emitting device with void.
Figure 4:
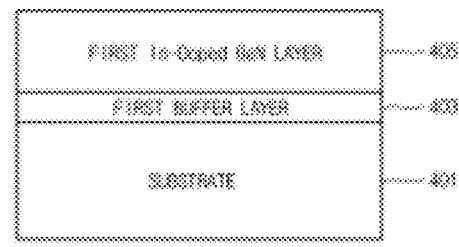
FIGS. 4 to 6 are views illustrating a method of fabricating a selective etched GaN and sapphire substrate (SEGSS) structure in a nitride semiconductor light emitting device according to the present invention. Specifically.
Figure 5:
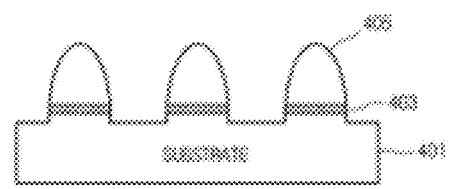
Figure 6:
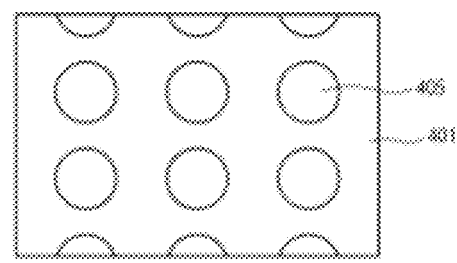

FIGS. 4 to 6 are views illustrating a method of fabricating a selective etched GaN and sapphire substrate (SEGSS) structure in a nitride semiconductor light emitting device according to the present invention.

In order to fabricate an SEGSS substrate of the present invention, a first layer 403 and a first In-doped GaN layer 405 are sequentially formed on a substrate 401, resulting in a staked structure as illustrated in FIG. 4.

The substrate 401 may be a sapphire substrate, a silicon carbide substrate, a silicon substrate, or a GaAs substrate. The first buffer layer 403 may be a stack structure of AlInN/GaN, a super lattice structure of InGaN/GaN, a stack structure of $In_xGa_{1-x}N/GaN$, or a stack structure of $Al_xIn_yGa_{1-(x+y)}N/In_xGa_{1-x}N/GaN$. Although FIG. 4 illustrates an In-doped GaN layer 405 as the GaN layer formed on the first buffer layer 403, the GaN layer 405 can also be an undoped-GaN layer or a GaN layer formed by doping other material. For example, the doping material may be indium, silicon, indium/silicon, or aluminum. The GaN layer 405 may be comprised of more than two layers, including a layer with a doping concentration of $1 \sim 9 \times 10^{17}/cm^3$ and a layer with a doping concentration of $1 \sim 9 \times 10^{17}/cm^3$. Preferably, the first buffer layer 403 is formed on the substrate 401 by growing a multi buffer layer of $1^{st}$ AlInN/$1^{st}$ GaN/$2^{nd}$ AlInN/$2^{nd}$ GaN at a low temperature, and the first In-doped GaN layer 405 is grown to a thickness of $1 \sim 2$ μm at a high temperature.

Next, a circular masking material with a diameter of $3 \sim 5$ μm is selectively patterned by a photography process.

Then, the surface of the substrate 401 and the masking material are simultaneously etched by an etching process (e.g., a dry etching process), resulting in an SEGSS structure as illustrated in FIGS. 5 and 6. FIG. 5 is a sectional view of the SEGSS structure after the etching process and FIG. 6 is a plan view of the SEGSS structure after the etching process.

Referring to FIGS. 5 and 6, the substrate 401 itself is etched for a portion of the SEGSS substrate. In the non-etched region of the substrate 401, the first buffer layer 403 and the first In-doped GaN layer 405 are positively etched to have a protruded stack structure of a cone shape with a smoothly inclined surface. A circular masking patterning is selectively performed during the photolithography process. In a region where the circular masking still remains, the first buffer layer 403 and the first In-doped GaN layer 405 construct a cone-shaped stack structure. In a region where no masking is formed, the substrate 401 itself is etched. Therefore, the substrate 401 is etched to a predetermined depth. At this point, a diameter of the circular masking may be in a range from 3 μm to 5 μm.

Also, unlike the related art method, the SEGSS structure is formed using a difference of an etch rate between the sapphire substrate and the mask material. According to the present invention, a region where the masking is not performed is first etched and a region where the masking is performed is then etched from an edge portion of the mask material as the etching process is in progress. Consequently, the mask material is completely etched and thus the GaN layer and the surface of the sapphire substrate are simultaneously etched to thereby change from the circular shape to the cone shape. In this way, the SEGSS structure can be formed.

Afterwards, the buffer layer and the GaN layer are re-grown on the SEGSS structure, so that the optical extraction efficiency of the nitride semiconductor light emitting device is improved.

Figure 7:
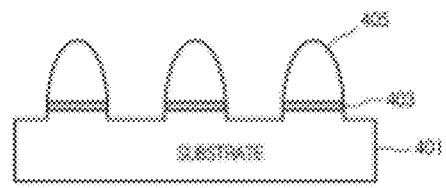
FIG. 7 is a sectional view of an SEGSS structure.

FIG. 7 is a sectional view of the SEGSS structure. The fabrication method of the SEGSS will be described below with reference to FIG. 7.

The first buffer layer 403 is grown on the substrate 401 at a low temperature. The good-quality In-doped GaN layer 405 is grown to a thickness of 1~3 μm and patterned in a circular mask shape by using the photolithography process. The surface of the substrate 401 (e.g., sapphire substrate) and the masking material are dry etched such that the surface of the sapphire substrate is etched to a desired etch depth. At this point, the etch depth of the sapphire substrate is dependent on the masking material that is etched at the same time. Preferably, the surface of the substrate is etched in a range of 0.3~1 μm in order to obtain the effect of the optical extraction efficiency of the nitride semiconductor light emitting device.

Figure 8:
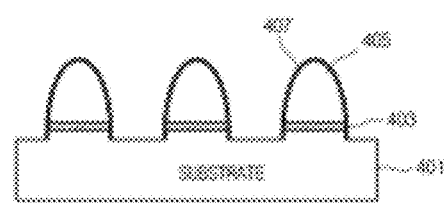
FIG. 8 is a sectional view of an SEGSS structure in which an insulation layer is formed.

Referring to FIG. 8, after the SEGSS structure is formed, an insulation layer 407 of 1000 Å is formed on the SEGSS structure. The insulation layer 407 may be formed of $SiO_2$. After forming the insulation layer 407, only the cone-shaped region remains and the $SiO_2$ insulation layer is removed from the surface of the sapphire substrate for the re-growth. The process of patterning the insulation layer 407 prevents the growth of the GaN layer on the cone-shaped first In-doped GaN layer during a secondary re-growth that will be described later and allows the GaN layer to re-grow only on the surface of the etched sapphire substrate. Of course, the process of providing the insulation layer 407 only with respect to the substrate 401 can be performed by a masking and an etch.

Figure 9:
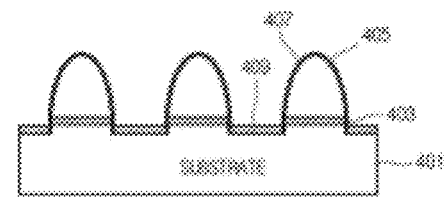
FIG. 9 is a sectional view of an SEGSS structure in which a second buffer layer is formed.

Referring to FIG. 9, the second buffer layer 409 is formed on the resulting structure. The second buffer layer 409 may be formed of the same material as that of the first buffer layer 403. The second buffer layer 409 may have a stack structure of AlInN/GaN, a super lattice structure of InGaN/GaN, a stack structure of $In_xGa_{1-x}N$/GaN, or a stack structure of $Al_xIn_yGa_{1-(x+y)}N/In_xGa_{1-x}N$/GaN. Specifically, the second buffer layer 409 is grown at a low temperature in order to re-grow the secondary GaN layer on the SEGSS structure where the $SiO_2$ insulation layer is selectively formed.

Then, the second In-doped GaN layer (411 in FIG. 10) is grown at a high growth temperature.

The second In-doped GaN layer 411 is re-grown to a predetermined thickness to completely cover the first In-doped GaN layer 405 that has been already formed in the cone shape. The second In-doped GaN layer 411 is not grown on the surface of the insulation layer (e.g., the $SiO_2$ insulation layer), but it is grown only on the surface of the etched substrate 401.

In the initial growth after the formation of the second buffer layer 409 during the re-growth of the GaN layer in the SEGSS structure, a vertical growth of a c-axis direction is dominantly progressed in the etched region of the sapphire substrate. The reason for this is that due to a difference of surface energy of the etched sapphire substrate, even though the same buffer layers are formed, an initial GaN seed density is reduced by a difference of the growth thickness and crystallinity of the buffer layer, and a vertical growth is more dominant than a lateral growth during a process of fusing islands formed as the growth is in progress. That is, after the buffer layer is grown at a low temperature in the generally used sapphire substrate, island density of the initial growth of the GaN layer formed at a high temperature is large and thus the recombination of the islands is actively achieved. Consequently, the vertical growth of the c-axis direction is dominantly in progress. Therefore, when the buffer layer is grown to more than a critical thickness of 0.5 μm, the second In-doped GaN layer 411 of a mirror face with good-quality crystallinity can be re-grown.

In order to grow the second In-doped GaN layer 411 with good-quality crystallinity in the secondary re-growth, the optimization of the growth condition of the existing second buffer layer 409 is required because the surface state and surface energy of the etched sapphire substrate 401 is different. Generally, the growth rate of the second In-doped GaN layer 411 at a high temperature, the V/III ratio, and the growth temperature serve as an important critical growth factor.

Figure 10:
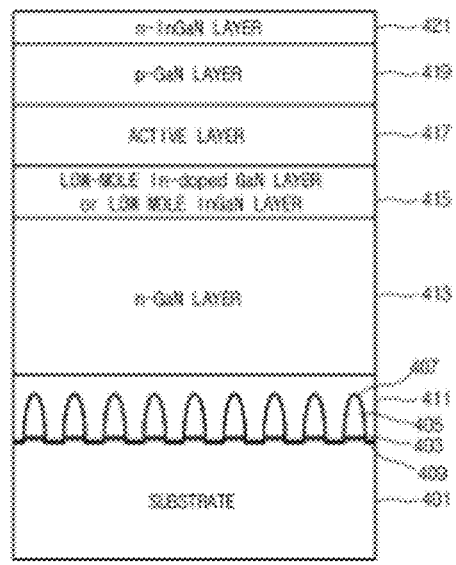
FIG. 10 is a sectional view of the nitride semiconductor light emitting device according to the first embodiment of the present invention.

FIG. 10 is a sectional view of the nitride semiconductor light emitting device according to the first embodiment of the present invention.

Referring to FIG. 10, an n-GaN layer 413, a low-mole In-doped GaN layer or low-mole InGaN layer 415, an active layer 417, a p-GaN layer 419, and an n-InGaN layer 421 are sequentially formed on the second In-doped GaN layer 411. In this way, the nitride semiconductor light emitting device with improved optical extraction efficiency can be fabricated.

Also, in forming the n-GaN layer 413 used as the first electrode contact layer, the super lattice layer of AlGaN/n-GaN can be formed. At this point, the super lattice layer of AlGaN/n-GaN includes s a undoped AlGaN layer grown in a thickness range of 10~200 Å and an Al composition of which is 0.01~0.02, and a silicon-doped n-GaN layer having a thickness of below 300 Å. Also, the super lattice layer of AlGaN/n-GaN has one period consisting of an AlGaN layer and an n-GaN layer and are grown below 400 Å, and the period is repeated to grow to a total thickness of below 2 μm.

Also, the first electrode contact layer may be formed in a super lattice structure having one period consisting of AlGaN/undoped-GaN/GaN(Si), further the first electrode contact layer could have a formation such that the one period repeats at least two times. GaN(Si) represents a GaN layer formed by doping Si.

Also, the first electrode contact layer may be formed of an n-GaN layer in which Si/In or Si/Al are simultaneously doped. At this point, a doping concentration may be in a range of $2\sim9\times10^{18}$ cm$^3$.

Also, in order to increase the internal quantum efficiency of the active layer 417, a low-mole In-doped GaN layer or low-mole InGaN layer 415 is grown such that a strain of the active layer 417 can be controlled before growing the active layer 417. In growing the low-mole In-doped GaN layer or low-mole InGaN layer 415, the content of a doped Indium is less than 5%. Also, in growing the low-mole In-doped GaN layer or low-mole InGaN layer 415, its thickness is in a range of 100-300 Å. After the growth mode is artificially controlled such that the low-mole In-doped GaN layer or low-mole InGaN layer 415 has a spiral shape, the active layer 417 is grown on the spiral low-mole In-doped GaN layer or low-mole InGaN layer 415.

The active layer 417 emitting light of a desired wavelength band is formed in a single quantum well layer or a multi quantum well layer of $In_xGa_{1-x}N(15\sim35\%)/In_yGa_{1-y}N$ (less than 5%) comprised of a well layer and a barrier layer. Although not shown, an SiNx cluster layer may be further formed between the well layer and the barrier layer. The SiNx cluster layer is formed in an atom scale and increases the luminous efficiency of the active layer 417.

Also, after growing the active layer 417, a p-GaN layer 419 is grown at an increased growth temperature and in NH$_3$/H$_2$ ambient to a total thickness of about 1000 Å. The p-GaN layer has u-GaN/Mg-doped p-GaN/Mg$^{++}$ (delta doping) as one period. The p-GaN layer is grown by repeating the period. A thickness of one period is less than 250 Å and an Mg doping efficiency is improved.

Also, the p-GaN layer 419 has a super lattice structure of GaN/GaN(Mg) or u-GaN/(Mg$^{++}$)/GaN(Mg)/(Mg$^{++}$) as one period. The p-GaN layer 419 may be grown to a thickness range of 500~5000 Å by repeating the period. Here, the Mg$^{++}$ layer represents a layer formed by a delta doping. For example, the Mg$^{++}$ layer may be formed by a delta doping in 1~60 seconds without supplying Ga.

Also, the p-GaN layer 419 is formed in a super lattice structure having at least one period of GaN/AlGaN(Mg), GaN/AlGaN(Mg)/GaN(Mg), or GaN/(Mg$^{++}$)/AlGaN(Mg)/(Mg$^{++}$)/GaN(Mg). The Mg$^{++}$ layer may be formed by a delta doping in NH$_3$/H$_2$ ambient for 1~60 seconds.

Also, the second electrode contact layer grows an n-InGaN layer 421 having a thickness of less than 60 Å and finally forms a light emitting device with an n-/p-/n-junction structure, an optical power of which is improved by 10~20%. At this point, the n-InGaN layer 421 may be grown in a super grading structure in which the contents of indium is sequentially controlled. Further, the second electrode material formed on the n-InGaN layer 421 is determined by a difference of a doping phase or energy band gap of the n-InGaN layer 421. However, since the n-InGaN layer 421 has a super grading structure in which energy band gap is controlled by linearly changing the contents of indium in order to increase a current spreading effect, a transparent oxide and a transparent resistive metal may be used as the second electrode material. Specifically, ITO, IZO(In—ZnO), GZO(Ga—ZnO), AZO(Al—ZnO), AGZO(Al—Ga ZnO), IGZO(In—Ga ZnO), IrO$_x$, RuO$_x$, or RuO$_x$/ITO, Ni/IrO$_x$/Au, Ni/IrO$_x$/Au/ITO may be used.

Also, the second electrode contact layer may be formed in a super lattice structure of n-InGaN/InGaN. In this case, the above-described transparent electrode can also be equally applied.

According to the present invention, a buffer layer is grown on a substrate at a low temperature and a GaN layer with a good crystallinity is grown at a high temperature. Then, a masking is selectively performed and a positive dry etch is performed such that a shape, from the GaN layer to the sapphire substrate, is formed in a cone shape. Using this patterned SEGSS structure, the optical power and operational reliability are improved. Unlike the related art method, the SEGSS structure is formed using a difference of an etch rate between the sapphire substrate and the mask material in order to implement the corn shape.

According to the present invention, the surface of the sapphire substrate is first etched and the mask material is then etched from its edge portion as the etching process is in progress. Consequently, the mask material is completely etched and thus the GaN layer and the surface of the sapphire substrate are simultaneously etched to thereby change from the circular shape to the cone shape. In this way, the SEGSS structure can be formed. In an embodiment, as seen in FIG. 10, a distance between side surfaces of two non-etched regions of the substrate can be greater than a depth of an etched region of the substrate. In addition, a side surface of each non-etched region of the substrate can include a convex surface.

Also, the nitride semiconductor light emitting device is grown by secondarily re-growing a buffer layer and a GaN layer in the selectively etched SEGSS at a low temperature. Therefore, the optical extraction efficiency is improved and a leakage current can be prevented in the re-growth. The degree of the cone shape is determined depending on the thickness of the initial GaN layer and the state of the mask material. In order to etch the GaN layer with good crystallinity, the GaN layer has to be grown above a critical thickness in which a lateral growth is completely achieved.

Also, light emitted toward the substrate is reflected from the surface of the substrate toward the surface of the light emitting device, thus improving the optical extraction efficiency. Consequently, the luminous efficiency is improved.

EMBODIMENT 2

Figure 11:
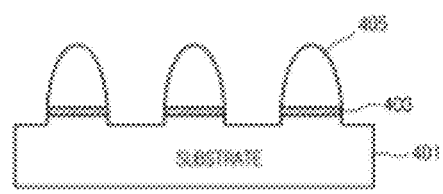
FIGS. 11 and 12 are views illustrating a method of fabricating a nitride semiconductor light emitting device according to a second embodiment of the present invention. Specifically.
Figure 12:
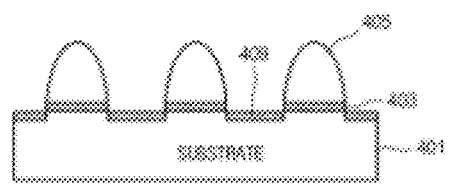
Figure 13:
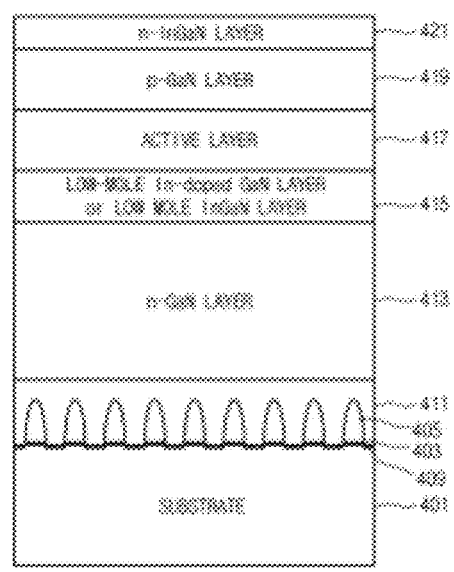
FIG. 13 is a sectional view of the nitride semiconductor light emitting device according to the second embodiment of the present invention.

FIGS. 11 and 12 are views illustrating a method of fabricating a nitride semiconductor light emitting device according to a second embodiment of the present invention. FIG. 13 is a sectional view of the nitride semiconductor light emitting device according to the second embodiment of the present invention.

Referring to FIGS. 11, 12 and 13, the second embodiment is similar to the first embodiment, except that the process of patterning the insulation layer 407 on the first In-doped GaN layer 405 is omitted. Therefore, the difference only will be described.

According to the second embodiment of the present invention, a secondary GaN layer is re-grown on the SEGSS structure, without performing the process of patterning the SiO$_2$ insulation layer. The secondary GaN growth is performed in a state that the etched corn-shaped GaN layer and the surface of the etched sapphire substrate are exposed.

In the secondary re-growth of the GaN layer, due to the strain change caused by the difference of the surface state and the surface energy of the surface of the cone-shaped GaN layer and the surface of the sapphire substrate, the surface of the cone-shaped GaN layer is grown in a GaN seed shape with respect to the same growth time, and the growth is dominantly progressed only in the surface of the etched sapphire substrate. In other words, even though the surface of the cone-shaped GaN layer is exposed to the growth ambient, the GaN layer is dominantly grown in the c-axis direction in the surface of the etched sapphire substrate. On the contrary, the GaN layer is vertically grown in all directions following the curved surface in an inclined portion with respect to the c-axis direction, the growth is difficult to progress.

Also, in the re-growth according to the second embodiment of the present invention, the second In-doped GaN layer 411 further stacked on the second buffer layer 409 is dominantly grown in the c-axis direction. Due to the smoothly curved surface of the cone shape, crystal defect that has occurred in the existing PSS method can be reduced. Consequently, the leakage current of the light emitting device can be suppressed and thus the reliability can be improved. Further, since the surface energy is strong in the curved surface of the cone-shaped end portion, the direction of a threading dislocation (TD) occurring in the surface of the substrate and propagating to the surface of the light emitting device is bent in a horizontal direction, thus preventing the propagation.

INDUSTRIAL APPLICABILITY

The present invention can improve the optical extraction efficiency of the nitride semiconductor light emitting device.

What is claimed is:

1. A light emitting device comprising:
   a substrate having a plurality of patterns;
   a first conductive semiconductor layer on a buffer layer, wherein the first conductive semiconductor layer includes first to third GaN-based layers, wherein the first GaN-based layer includes Si dopant, the second Ga-based layer includes a dopant having a lower concentration of Si than the first GaN-based layer, and the third GaN-based layer includes In material, wherein the first conductive semiconductor layer further comprises a fourth GaN-based layer including Al material, and wherein the fourth GaN-based layer has a planar surface;
   an active layer on the third GaN-based layer of the first conductive semiconductor layer, wherein the active layer comprises a single quantum well layer or a multi quantum well layer of $In_xGa_{1-x}N/In_yGa_{1-y}N$; and
   a second conductive semiconductor layer on the active layer.

2. The light emitting device according to claim 1, wherein the substrate includes one of sapphire, silicon carbide, silicon, or GaAs.

3. The light emitting device according to claim 1, further comprising a contact layer on the second conductive semiconductor layer.

4. The light emitting device according to claim 3, wherein the first conductive semiconductor layer and the contact layer have a first conductivity and the second conductive semiconductor layer has a second conductivity, and
   wherein the first conductivity and the second conductivity are different from each other.

5. The light emitting device according to claim 1, further the buffer layer on the substrate.

6. The light emitting device according to claim 5, wherein the buffer layer includes one of a stack structure of AlInN/GaN, a super lattice structure of InGaN/GaN, a stack structure of $In_xGa_{1-x}N/GaN$, a stack structure of $Al_xIn_yGa_{1-(x+y)}N/In_xGa_{1-x}N/GaN$, an undoped GaN layer, or doped GaN layer.

7. The light emitting device according to claim 1, further comprising a transparent electrode on the second conductive semiconductor layer.

8. The light emitting device according to claim 1, wherein the second conductive semiconductor layer includes a super lattice structure.

9. The light emitting device according to claim 8, wherein one period of the super lattice structure has a thickness less than 250 Å.

10. The light emitting device according to claim 1, wherein the third GaN-based layer has a content of an Indium of less than 5%.

11. The light emitting device according to claim 1, wherein the first conductive semiconductor layer includes an Al-doped layer.

12. The light emitting device according to claim 1, wherein a width of an upper portion of the pattern is narrower than a width of a lower portion of the pattern.

13. The light emitting device according to claim 1, further at least one of the buffer layer and a fifth GaN-based layer on the patterns to form a protrusion shape.

14. The light emitting device according to claim 13, wherein the fifth GaN-based layer includes In material.

* * * * *